United States Patent
Imazeki et al.

(10) Patent No.: US 9,602,066 B2
(45) Date of Patent: Mar. 21, 2017

(54) POLARITY-SWITCHING AMPLIFIER CIRCUIT

(71) Applicant: PANASONIC INTELLECTUAL PROPERTY MANAGEMENT CO., LTD., Osaka (JP)

(72) Inventors: Isao Imazeki, Osaka (JP); Masaki Kanemaru, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 28 days.

(21) Appl. No.: 14/404,135

(22) PCT Filed: Mar. 20, 2014

(86) PCT No.: PCT/JP2014/001656
§ 371 (c)(1),
(2) Date: Nov. 26, 2014

(87) PCT Pub. No.: WO2014/156101
PCT Pub. Date: Oct. 2, 2014

(65) Prior Publication Data
US 2015/0137892 A1    May 21, 2015

(30) Foreign Application Priority Data

Mar. 29, 2013    (JP) ................. 2013-073669

(51) Int. Cl.
*H03F 1/14*    (2006.01)
*H03F 3/193*    (2006.01)
(Continued)

(52) U.S. Cl.
CPC ............. *H03F 3/193* (2013.01); *H03F 1/223* (2013.01); *H03F 3/211* (2013.01);
(Continued)

(58) Field of Classification Search
CPC . H03F 1/223; H03F 1/565; H03F 3/04; H03F 3/24; H03F 3/68; H03F 3/189;
(Continued)

(56) References Cited

U.S. PATENT DOCUMENTS 3,512,109 A * 5/1970 Grace ...................... H03C 3/00
327/215
4,608,541 A    8/1986 Moriwaki et al.
(Continued)

FOREIGN PATENT DOCUMENTS

JP    S61-089704 A    5/1986
JP    H11-317019 A    11/1999
(Continued)

OTHER PUBLICATIONS

Alberto Valdes-Garcia et. al. : "A Fully Integrated 16-Element Phased-Array TX in Sige BICMOS for 60-GHz Communications", IEEE Journal of Solid-State Circuits, Vol. 45, No. 12, Dec. 2010.
(Continued)

*Primary Examiner* — Steven J Mottola
*Assistant Examiner* — Hafizur Rahman
(74) *Attorney, Agent, or Firm* — Pearne & Gordon LLP

(57) ABSTRACT

A polarity-switching amplifier circuit includes: a first amplifying transistor and a second amplifying transistor, a transformer which includes a primary winding and a secondary winding, and a polarity-switching controller. An unbalanced input signal is input to the first amplifying transistor and the second amplifying transistor. The transformer receives an output signal of the first amplifying transistor and an output signal of the second amplifying transistor as a balanced signal input to the primary winding, and outputs a signal from the secondary winding. The polarity-switching controller turns on one of the first amplifying transistor and the second amplifying transistor and turns off the other thereof.

17 Claims, 10 Drawing Sheets

(51) Int. Cl.
    *H03F 1/22*    (2006.01)
    *H03F 3/21*    (2006.01)
    *H03F 3/45*    (2006.01)
(52) U.S. Cl.
    CPC ..... *H03F 3/45179* (2013.01); *H03F 2200/09* (2013.01); *H03F 2200/222* (2013.01); *H03F 2200/451* (2013.01); *H03F 2200/541* (2013.01); *H03F 2203/45394* (2013.01); *H03F 2203/45644* (2013.01)
(58) Field of Classification Search
    CPC .......... H03F 3/193; H03F 3/211; H03F 3/245; H03F 3/265; H03F 3/45179; H03F 2200/09; H03F 2200/222; H03F 2200/318; H03F 2200/387; H03F 2200/451; H03F 2200/534; H03F 2200/541; H03F 2203/21106; H03F 2203/21142; H03F 2203/45644; H03F 2203/45394
    USPC ... 330/9, 195, 252–261, 273, 276, 296, 297, 330/301, 51; 327/237, 254, 255; 455/127.1, 129
    See application file for complete search history.

(56) References Cited

U.S. PATENT DOCUMENTS

| 2005/0286652 | A1* | 12/2005 | MacPhail ............... H03F 3/189 375/297 |
| 2012/0032741 | A1* | 2/2012 | De Maaijer ............ H04B 1/406 330/277 |
| 2013/0033296 | A1 | 2/2013 | Kishimoto |
| 2013/0099864 | A1 | 4/2013 | Kawai et al. |

FOREIGN PATENT DOCUMENTS

| JP | 2012-005077 A | 1/2012 |
| WO | 2011/132348 A1 | 10/2011 |

OTHER PUBLICATIONS

International Search Report for Application No. PCT/JP2014/001656 dated Jun. 14, 2014.

* cited by examiner

FIG. 3

|  | OUTPUT PHASE 0° | OUTPUT PHASE 180° |
|---|---|---|
| AMPLIFYING TRANSISTOR 100a | ON | OFF |
| AMPLIFYING TRANSISTOR 100b | OFF | ON |
| SWITCH 170a | OFF | ON |
| SWITCH 170b | ON | OFF |
| SWITCH 172a | ON | OFF |
| SWITCH 172b | OFF | ON |
| POWER SOURCE SWITCH CIRCUIT 118a | OFF | ON |
| POWER SOURCE SWITCH CIRCUIT 118b | ON | OFF |
| IMPEDANCE ADJUSTMENT CIRCUIT 120a | OFF | ON |
| IMPEDANCE ADJUSTMENT CIRCUIT 120b | ON | OFF |

FIG. 7

|  | OUTPUT PHASE 0° | OUTPUT PHASE 180° |
|---|---|---|
| AMPLIFYING TRANSISTOR 100a | ON | OFF |
| AMPLIFYING TRANSISTOR 100b | OFF | ON |
| SWITCH 170a | OFF | ON |
| SWITCH 170b | ON | OFF |
| SWITCH 172a | ON | OFF |
| SWITCH 172b | OFF | ON |
| IMPEDANCE ADJUSTMENT CIRCUIT 418a | OFF | ON |
| IMPEDANCE ADJUSTMENT CIRCUIT 418b | ON | OFF |

POLARITY-SWITCHING AMPLIFIER CIRCUIT

TECHNICAL FIELD

The present disclosure relates to a polarity-switching amplifier circuit used for a phase shifter capable of changing phases of 0 to 360 degrees.

BACKGROUND ART

With the increase in the volumes of digital contents, wireless connection means of more than 1 Gbps is desired in information devices. As high-speed wireless connection means, millimeter-wave wireless communication using the 60-GHz band is promising. In recent years, transistor characteristics have improved because the process has been made fine, and operations in the 60-GHz band are also possible in CMOS devices.

A problem with the millimeter-wave wireless communication is that the higher the ability for the radio waves to advance straight is, the easier communication is intercepted by an intercepting object. One of the methods for solving the problem is beam forming.

Beam forming is a technology of arbitrarily switching the directivity of an array antenna by controlling the phase of the radio signal of each antenna at a plurality of antennas constituting the array antenna. By controlling the phase of the radio signal of each individual antenna so that the radio field intensity is an intense emission angle by using beam forming, efficient communication become possible. Moreover, in addition to wireless communication, in the field of radar, the beam forming technology is also used for accurately detecting the object.

Here, an important component circuit for implementing beam forming is a phase shifter. In order to make phases of 0 to 360 degrees variable, the phase shifter has, for example, a variable phase shifter that changes phases of 0 to 180 degrees and a polarity-switching amplifier circuit that switches a phase of 0 degrees or 180 degrees. Examples of conventional polarity-switching amplifier circuits include the one described in Non-Patent Document 1.

RELATED ART DOCUMENTS

Patent Documents

Non-Patent Document 1: Alberto Valdes-Garcia et al.: "A FULLY INTEGRATED 16-ELEMENT PHASED-ARRAY TX IN SIGE BICMOS FOR 60-GHz COMMUNICATIONS", IEEE JOURNAL OF SOLID-STATE CIRCUITS, VOL. 45, NO. 12, DECEMBER 2010

SUMMARY OF THE INVENTION

Problem to be Solved by the Invention

The polarity-switching amplifier circuit used for conventional phase shifters has a problem in that the power loss is high at the polarity switcher that switches the signal polarity. In particular, the influence of the power loss is high in circuits used in high-frequency bands such as a millimeter-wave band.

An object of the present disclosure is to provide a polarity-switching amplifier circuit with a low power loss.

Means for Solving the Problem

A polarity-switching amplifier circuit of the present disclosure includes: a first amplifying transistor and a second amplifying transistor, to which an unbalanced input signal is input; a transformer which includes a primary winding and a secondary winding, which receives an output signal of the first amplifying transistor and an output signal of the second amplifying transistor as a balanced signal input to the primary winding, and which outputs a signal from the secondary winding; and a polarity-switching controller which turns on one of the first amplifying transistor and the second amplifying transistor and turns off the other thereof.

Advantages of the Invention

According to the present disclosure, a polarity-switching amplifier circuit with a low power loss can be provided.

BRIEF DESCRIPTION OF THE DRAWINGS

FIG. 3 is a view showing the relation between the output phase setting and the on/off condition of each portion in the polarity-switching amplifier circuit according to the first embodiment.

FIG. 7 is a view showing the relation between the output phase setting and the on/off condition of each portion in the polarity-switching amplifier circuit according to the second embodiment.

MODE FOR CARRYING OUT THE INVENTION

<Circumstances that Lead to the Contents of Each Embodiment of the Present Disclosure>

First, before describing embodiments of the polarity-switching amplifier circuit according to the present disclosure, a problem with the polarity switcher that switches the signal polarity will be described.

Figure 9:
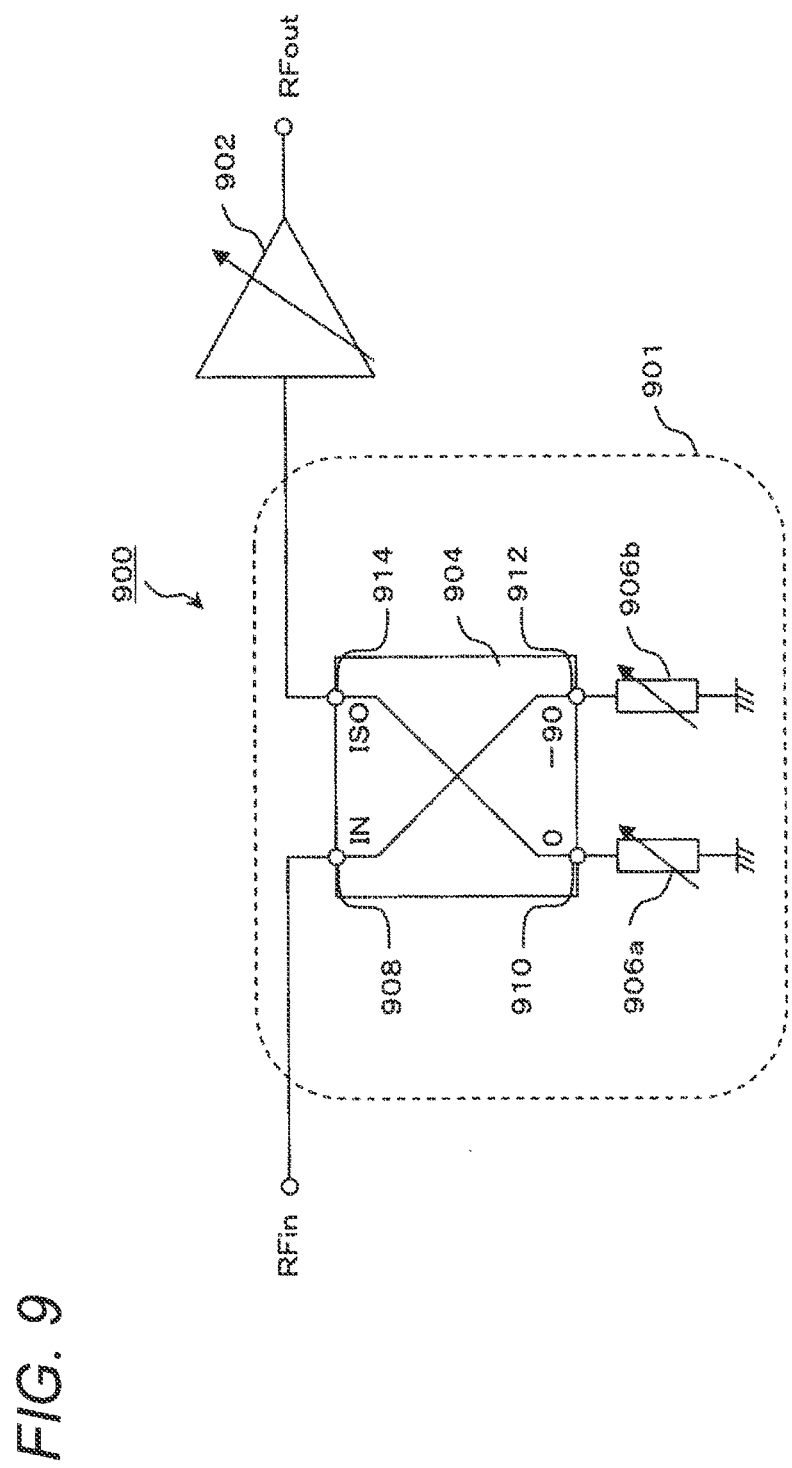
FIG. 9 is a block diagram showing the structure of a typical 360-degree variable phase shifter.

FIG. 9 is a block diagram showing the structure of a typical 360-degree variable phase shifter capable of changing phases of 0 to 360 degrees. The 360-degree variable phase shifter 900 is provided with a passive-type 180-degree variable phase shifter 901 that changes phases of 0 to 180 degrees and a polarity-switching amplifier circuit 902 that switches a phase of 0 degrees or 180 degrees.

The passive-type 180-degree variable phase shifter 901 is provided with a 90-degree hybrid 904 and variable reactance loads 906 (906a, 906b). The passive-type 180-degree variable phase shifter 901 is a phase shifter called a reflection-type phase shifter (RTPS).

The 90-degree hybrid is a four-terminal circuit, and has, as terminals of the input and output, an IN terminal (input terminal) 908, a 0-degree terminal 910, a −90-degree terminal 912 and an ISO terminal (output terminal) 914. In the reflection-type phase shifter, the variable reactance loads 906 are connected to the 0-degree terminal 910 and to the −90-degree terminal 112.

The signal input from the IN terminal 908 is reflected by the variable reactance loads 906a and 906b connected to the 0-degree terminal 910 and the −90-degree terminal 912 of the 90-degree hybrid 904, and is output to the ISO terminal 914. Here, the phase of the signal output to the ISO terminal 914 changes according to the impedances of the variable reactance loads 906a and 906b. By the above-described operation, the passive-type 180-degree variable phase shifter 901 operates as a 0-180-degree variable phase shifter.

In the reflection-type phase shifter, when the phase control range is increased, the power loss is increased by the non-ideal component, that is, the resistance component of the variable reactance loads 906. Moreover, a phenomenon occurs in which the set phase changes the contribution ratio of the resistance component to change the power loss amount. For this reason, as shown in FIG. 9, the 360-degree variable phase shifter 900 is constituted by the cascade connection of the passive-type 180-degree variable phase shifter 901 and the polarity-switching amplifier circuit 902.

Figure 10:
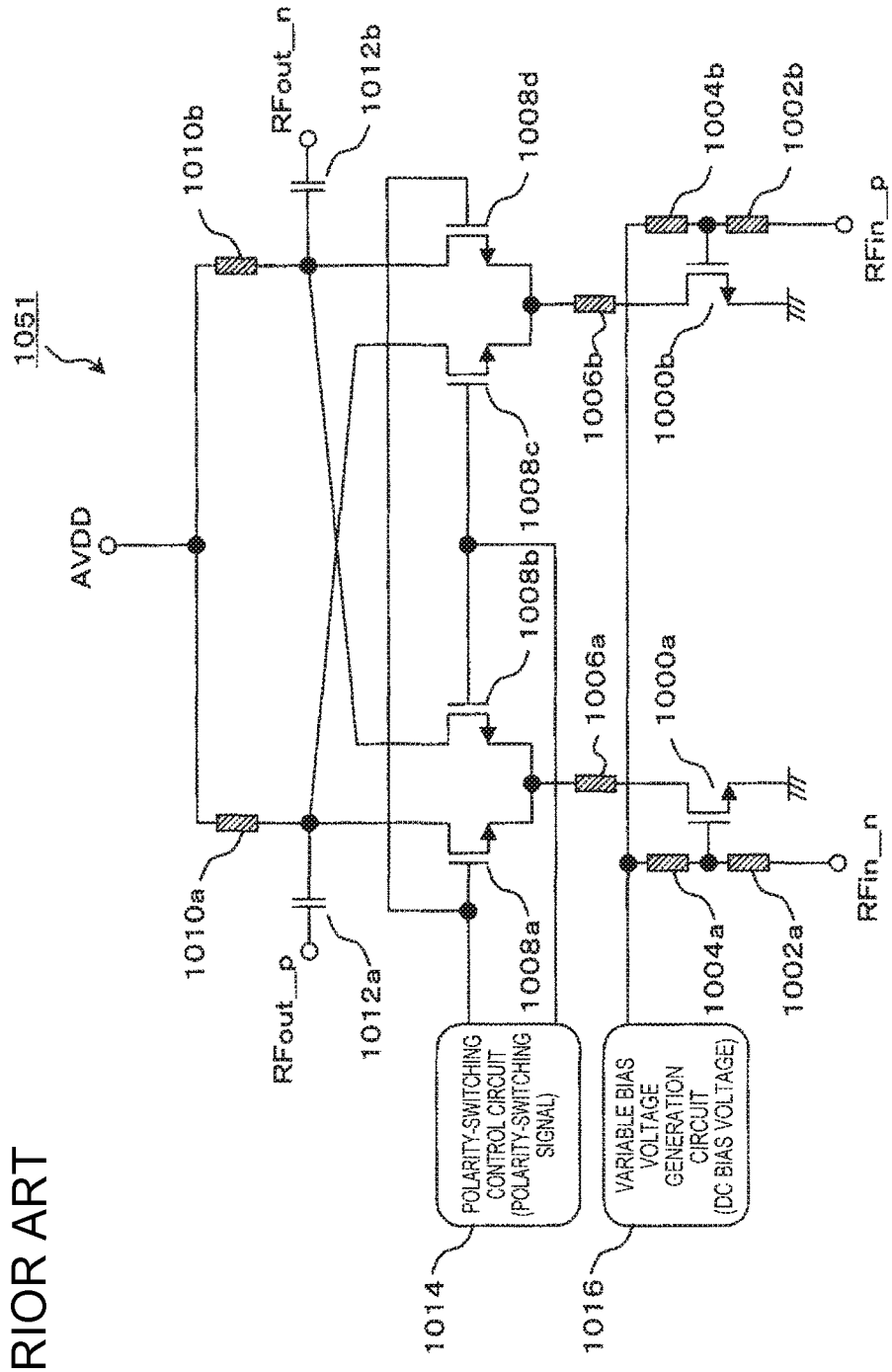
FIG. 10 is a block diagram showing the structure of a polarity-switching amplifier circuit of a conventional example.

FIG. 10 is a block diagram showing the structure of the polarity-switching amplifier circuit shown in Non-Patent Document 1 (FIG. 8) as a conventional example. Here, in FIG. 10, a bipolar transistor is rewritten to a MOSFET in the illustration.

The polarity-switching amplifier circuit 1051 of FIG. 10 is an amplifier circuit of a structure having balanced input terminals (RFin_p, RFin_n) and balanced output terminals (RFout_p, RFout_n). The polarity-switching amplifier circuit 1051 has amplifying transistors 1000 (1000a, 1000b) and transfer gates 1008 (1008a, 1008b, 1008c, 1008d). The source voltage is AVDD.

The balanced input signal is input to the amplifying transistors 1000 (1000a, 1000b) through input matching circuits 1002 (1002a, 1002b). In the amplifying transistors 1000a and 1000b, the DC bias voltage from a variable bias voltage generation circuit 1016 is supplied to the gates through bias supply circuits 1004 (1004a, 1004b). The output terminals (drain terminals) of the amplifying transistors 1000 are connected to the transfer gates 1008 (1008a, 1008b, 1008c, 1008d) through interstage matching circuits 1006 (1006a, 1006b).

According to which of 0 degrees and 180 degrees is selected as the phase of the balanced output of the polarity-switching amplifier circuit, on and off of the transfer gates 1008 are controlled by a polarity-switching signal from a polarity-switching control circuit 1014 responsive to the output phase selection. That is, when the output phase of 0 degrees is selected, the transfer gates 1008a and 1008d are on and the transfer gates 1008b and 1008c are off by the polarity-switching signal from the polarity-switching control circuit 1014. On the other hand, when the output phase of 180 degrees is selected, the transfer gates 1008b and 1008c are on and the transfer gates 1008a and 1008d are off by the polarity-switching signal.

The outputs of the transfer gates 1008 are connected to output loads 1010 (1010a, 1010b). The balanced output signal is output after the DC component is removed, through capacitive couplings 1012 (1012a, 1012b).

Moreover, by changing the DC bias supplied from the variable bias voltage generation circuit 1016 to the amplifying transistors 1000, a variable gain function where the gains of the amplifying transistors 1000 change can be implemented. By the variable gain function, the fluctuation in power loss amount due to the desired phase of the passive-type 180-degree variable phase shifter 901 is compensated, and the gain of the 360-degree variable phase shifter 900 shown in FIG. 9 in the whole phase range can be flattened.

In the polarity-switching amplifier circuit shown in FIG. 10, since the structure is such that the signal polarity is switched by the transfer gates when the phase is switched to 0 degrees or 180 degrees, a power loss due to the circuit configuration occurs.

In the structure example of FIG. 10, the transfer gates 1008 are disposed on the output sides of the amplifying transistors 1000, and the path to the output is switched to switch the polarity of the output. For this reason, a signal branch is necessary at the outputs of the amplifying transistors 1000.

For example, in a high-frequency signal such as a millimeter-wave signal using the 60-GHz band, a high power loss occurs due to the signal branch. In order to minimize the power loss at the signal branch, in the structure example of FIG. 10, the interstage matching circuits 1006 are provided between the output terminals of the amplifying transistors 1000 and the transfer gates 1008. However, this is not a fundamental solution because of a loss and a matching failure for a wide band by the interstage matching circuits.

Moreover, at the outputs of the transfer gates 1008, the paths of the transfer gates on the off side are connected in parallel with the output loads 1010. For this reason, when the transfer gate on the off side cannot be regarded as the open end, a power leakage occurs, so that a power loss occurs at the transfer gate output.

In view of the above-mentioned problem, the present disclosure provides an amplifier circuit where the loss is low when the phase is switched to 0 degrees or 180 degrees.

EMBODIMENTS OF THE PRESENT DISCLOSURE

Hereinafter, embodiments according to the present disclosure will be described in detail with reference to the drawings. In the drawings used for the description that follows, the same elements are denoted by the same reference numerals, and overlapping descriptions are omitted.

First Embodiment

Figure 1:
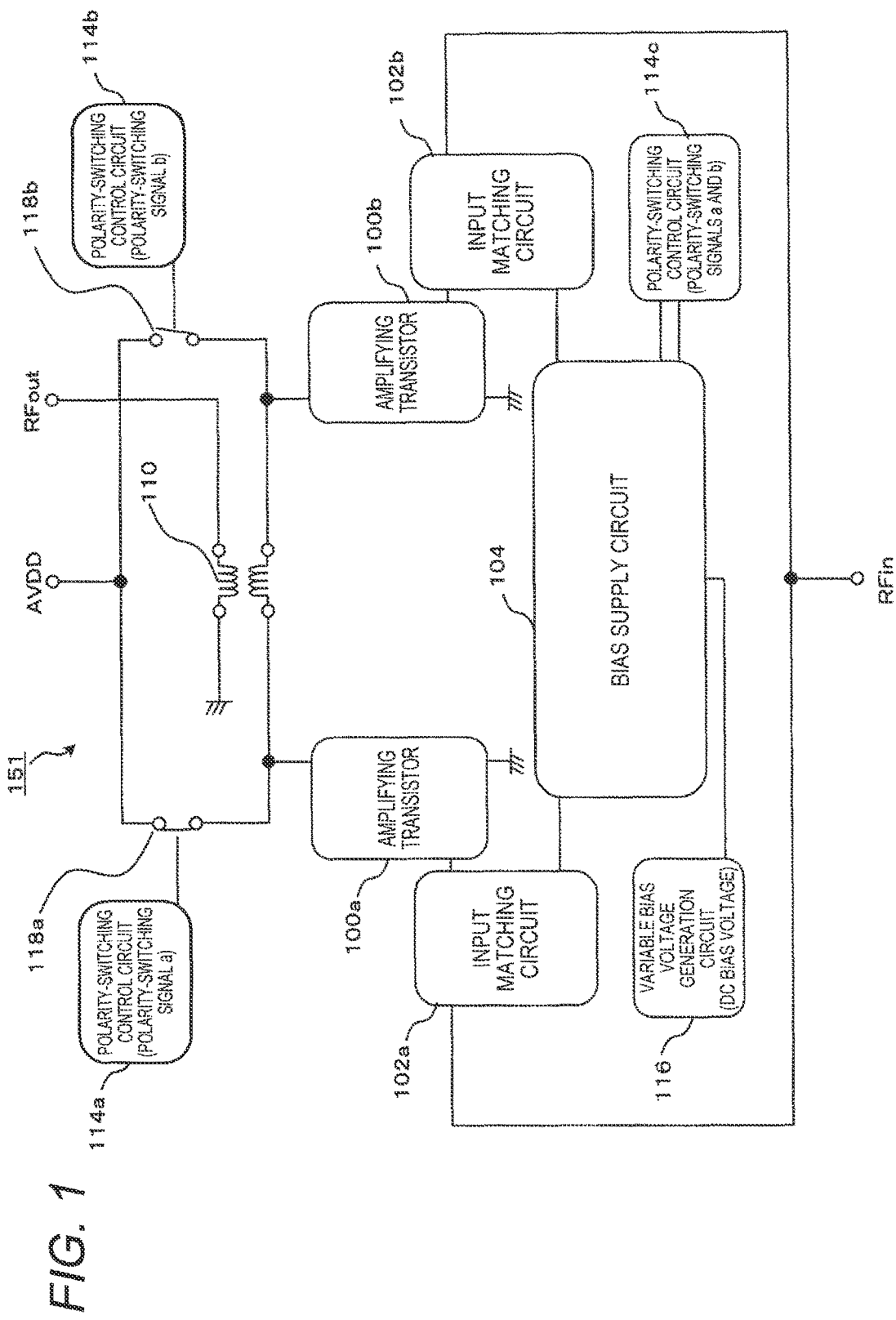
FIG. 1 is a block diagram showing the schematic structure of a polarity-switching amplifier circuit according to a first embodiment.

FIG. 1 is a block diagram showing the schematic structure of a polarity-switching amplifier circuit according to a first embodiment of the present disclosure.

The polarity-switching amplifier circuit 151 shown in FIG. 1 has amplifying transistors 100 (100a, 100b), input matching circuits 102 (102a, 102b), a bias supply circuit 104, polarity-switching control circuits 114 (114a, 114b, 114c), a variable bias voltage generation circuit 116, power source switch circuits 118 (118a, 118b), and a transformer 110. The polarity-switching amplifier circuit 151 has an unbalanced input terminal (RFin) and an unbalanced output terminal (RFout).

The unbalanced input terminal (RFin) is branched into two signal paths which are connected to the inputs of the amplifying transistors 100a and 100b through the input matching circuits 102a and 102b, respectively. Moreover, the amplifying transistors 100a and 100b are connected to the bias supply circuit 104 through the input matching circuits 102a and 102b and supplied with a DC bias voltage. To the bias supply circuit 104, the variable bias voltage generation circuit 116 that outputs a variable DC bias voltage and the polarity-switching control circuit 114c that outputs polarity-switching signals a and b are connected.

The polarity-switching control circuit 114c is to implement the function of the polarity-switching controller, and controls the switching between on and off of the output of the DC bias voltage of the bias supply circuit 104 by the polarity-switching signals a and b.

The transformer (also called balun) 110 has a four-terminal structure having a primary winding and a secondary winding where the primary winding side is balanced input terminals and the secondary winding side is balanced output terminals. The balanced input terminals of the transformer 110 are connected to the output terminals of the amplifying transistors 100a and 100b, respectively. One of the balanced output terminals of the transformer 110 serves as the unbalanced output terminal (RFout) and the other thereof is grounded to AC ground.

The output terminals of the amplifying transistors 100a and 100b are connected to the power source through the power source switch circuits 118a and 118b, respectively, and the source voltage AVDD is applied thereto. The power source switch circuits 118a and 118b are connected to the polarity-switching control circuits 114a and 114b that output the polarity-switching signals a and b, respectively.

The polarity-switching control circuits 114a and 114b are to implement the function of a power switch controller, and control the switching of the power source switch circuits 118a and 118b by the polarity-switching signals a and b. That is, by the power source switch circuit 118b, bias current is supplied to the first amplifying transistor 100a from the power source, and by the power source switch circuit 118a, bias current is supplied to the second amplifying transistor 100b from the power source.

In the present embodiment, an unbalanced signal is input from the unbalanced input terminal RFin as a one-phase input, and by the on/off of the DC bias voltage from the bias supply circuit 104, one of the first amplifying transistor 100a and the second amplifying transistor 100b is turned on and the other thereof is turned off. Thereby, the input signal flows to the path of the on-state amplifying transistor and is amplified.

The output terminals of the first amplifying transistor 100a and the second amplifying transistor 100b are connected to both ends of the balanced input terminals of the transformer 110, one of the balanced output terminals of the transformer 110 is grounded, and the other thereof is an unbalanced output terminal RFout to output a signal. Thereby, a polarity-reversed signal can be output without the provision of a branch by a transfer gate as in the conventional example at the output terminals (drains) of the amplifying transistors 100a and 100b.

In FIG. 1, since there is no branch, wiring for branching the signal at the output terminals of the first and second amplifying transistors 100a and 100b, the matching circuit provided at the branching portion, and connecting wiring for re-synthesizing the branched signals are unnecessary. Moreover, since the output terminals of the first and second amplifying transistors 100a and 100b are not directly connected, the degree of freedom of the impedance adjustment of the off-state amplifying transistor is increased.

Concrete Example of the First Embodiment

Figure 2:
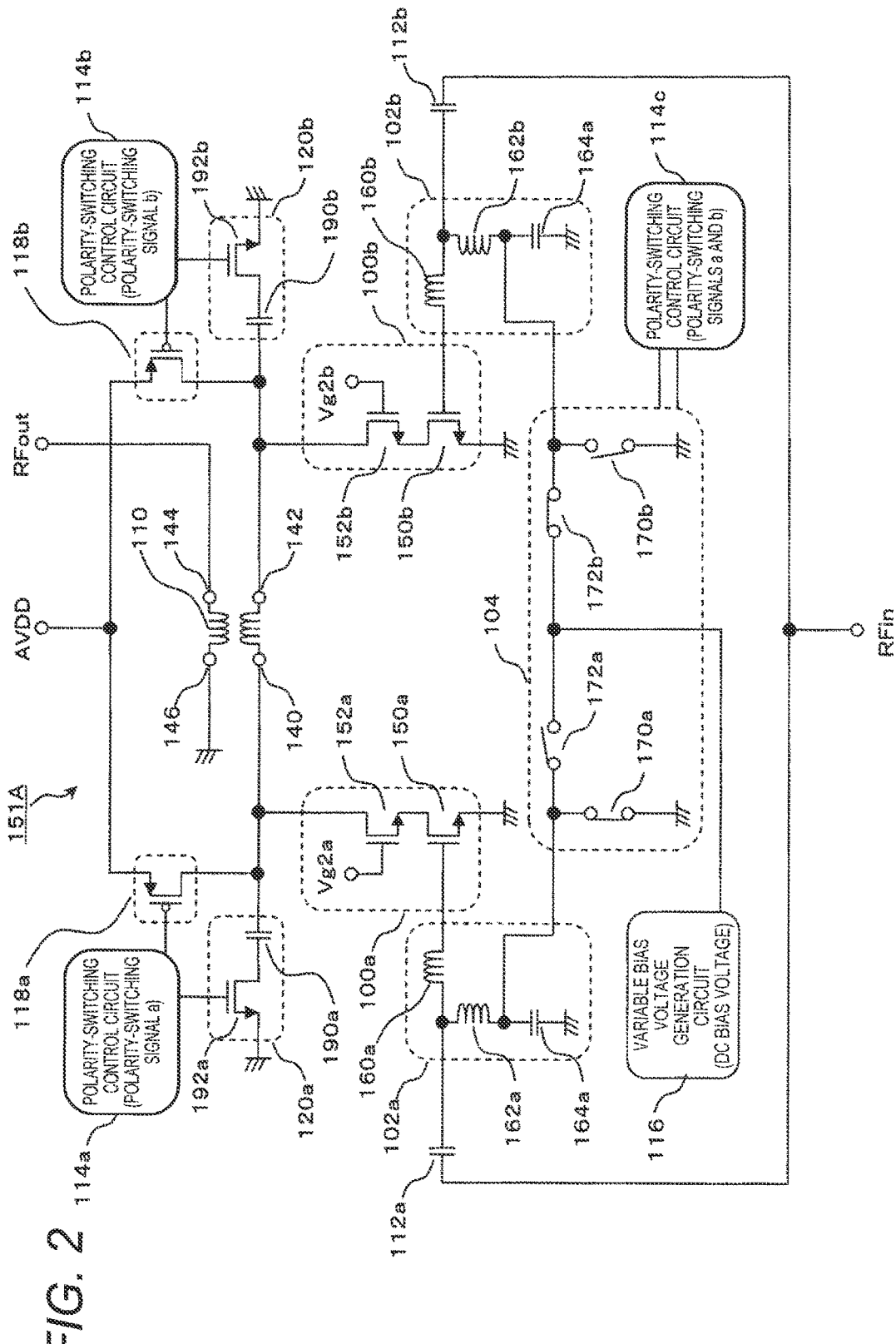
FIG. 2 is a block diagram showing the more detailed structure of the polarity-switching amplifier circuit according to the first embodiment.

FIG. 2 is a block diagram showing the more detailed structure of the polarity-switching amplifier circuit according to the first embodiment of the present disclosure. In FIG. 2, a concrete example of each circuit in the structure of the polarity-switching amplifier circuit shown in FIG. 1 is shown, and further, a structure provided with additional circuits such as an impedance adjustment circuit is shown.

A polarity-switching amplifier circuit 151A shown in FIG. 2 has, in addition to the structure of FIG. 1, capacitive couplings 112 (112a, 112b) and impedance adjustment circuits 120 (120a, 120b).

The impedance adjustment circuits 120 have the function of adjusting the impedance on the side of the power source switch circuit that supplies bias current to the on-state amplifying transistor, by turning on the off-state amplifying transistor side.

The unbalanced input terminal (RFin) is branched into two signal paths which are connected to the input matching circuits 102 (102a, 102b) through the capacitive couplings 112 (112a, 112b).

The input matching circuits 102 (102a, 102b) have, for example, inductors 160 (160a, 160b) and 162 (162a, 162b) and capacitances 164 (164a, 164b).

One inductors 160a and 160b are series-connected between the capacitive couplings 112a and 112b and the amplifying transistors 100a and 100b, and the other inductors 162a and 162b have one ends thereof series-connected to the inductors 160a and 160b and the other ends thereof grounded through the capacitances 164a and 164b. The other ends of the inductors 162a and 162b are connected to the bias supply circuit 104.

The bias supply circuit 104 has, for example, switches 170a, 170b, 172a and 172b. One ends of the switches 172a and 172b are connected to the variable bias voltage generation circuit 116 and the other ends of the switches 172a and 172b are connected to the input matching circuits 102a and 102b, respectively. Moreover, to the other ends of the switches 172a and 172b, one ends of the switches 170a and 170b are connected, and the other ends of the switches 170a and 170b are grounded. The bias supply circuit 104 is connected to the polarity-switching control circuit 114c, and the switches 170a, 170b, 172a and 172b are switched by the polarity-switching signals a and b.

The bias supply circuit 104 has the function of supplying the DC bias voltage from the variable bias voltage generation circuit 116 to the side of the amplifying transistor that is to be turned on, by switching the switches 170a, 170b, 172a and 172b. The input matching circuits 102 have the function of matching the input impedance of the on-state amplifying transistor with the impedance of the input signal source and increasing the input impedance of the off-state amplifying transistor according to the switching of the switches 170a, 170b, 172a and 172b of the bias supply circuit 104.

The first amplifying transistor 100a and the second amplifying transistor 100b are formed of, for example, dual-gate MOSFETs, and have first MOSFETs 150 (150a, 150b) and second MOSFETs 152 (152a, 152b) that are connected in cascade. The gates of the first MOSFETs 150a and 150b are input terminals and connected to the input matching circuits 102a and 102b, and the sources of the first MOSFETs 150a and 150b are grounded. The drains of the second MOSFETs 152a and 152b are output terminals, the drain of the second MOSFET 152a is connected to a negative terminal 140 of the balanced input of the transformer 110, and the drain of the second MOSFET 152b is connected to a positive terminal 142 of the balanced input of the transformer 110.

The power source switch circuits 118 (118a, 118b) are formed of, for example, pMOSFETs. To the gates of the pMOSFETs, the polarity-switching control circuits 114a and 114b are connected, and the power source switch circuits 118a and 118b by the pMOSFETs are switched between on and off by the polarity-switching signals a and b.

The impedance adjustment circuits 120 (120a, 120b) have, for example, capacitances 190 (190a, 190b) and nMOSFETs 192 (192a, 192b). That is, the impedance adjustment circuits 120a and 120b have a series connection of a transistor and a capacitance, and are capable of changing the impedance by switching on and off of the transistor. The impedance adjustment circuits 120a and 120b have the function of reducing the impedance on the side of the power source switch circuits 108a and 108b that supply bias current from the power source. One ends of the capacitances 190a and 190b are connected to the amplifying transistors 100a and 100b, the power source switch circuits 118a and 118b and the negative terminal 140 and the positive terminal 142 of the balanced input of the transformer 110.

That is, to the positive terminal 142 of the balanced input of the transformer 110, the power source switch circuit 118b and the impedance adjustment circuit 120b are connected, and to the negative terminal 140 of the balanced input of the transformer 110, the power source switch circuit 118a and the impedance adjustment circuit 120a are connected.

The other ends of the capacitances 190a and 190b of the impedance adjustment circuits 120 are connected to the drains of the nMOSFETs 192a and 192b, and the sources of the nMOSFETs 192a and 192b are grounded. The gates of the nMOSFETs 192a and 192b are connected to the polarity-switching control circuits 114a and 114b, and the nMOSFETs 192a and 192b are switched between on and off by the polarity-switching signals a and b.

The polarity-switching control circuits 114a and 114b are to implement the function of an impedance controller in addition to the function of the power switch controller, and control the impedance by switching the impedance adjustment circuits 120a and 120b by the polarity-switching signals a and b.

The input signal is input to the first amplifying transistor 100a and the second amplifying transistor 100b through the capacitive couplings 112a and the 112b and the input matching circuits 102a and 102b. The input signal is amplified by either of the first amplifying transistor 100a and the second amplifying transistor 100b. The output of the first amplifying transistor 100a is input to the negative terminal 140 of the balanced input of the transformer 110, and the output of the second amplifying transistor 100b is input to the positive terminal 142 of the balanced input of the transformer 110.

The signal input to the balanced input of the transformer 110 is output from a positive terminal 144 of the balanced input of the transformer 110 and a negative terminal 146 of the balanced input. In the illustrated example, the negative terminal 146 of the balanced output of the transformer 110 is grounded to AC ground, and an output signal is output from the positive terminal 144 (RFout) of the balanced output.

Next, the polarity-switching function of the polarity-switching amplifier circuit according to the first embodiment will be described. FIG. 3 is a view showing the relation between the output phase setting and the on/off condition of each portion in the polarity-switching amplifier circuit according to the first embodiment, and shows the condition of each portion when the output phase is 0-degree setting or 180-degree setting.

The polarity-switching control circuit 114c outputs the polarity-switching signals a and b to the bias supply circuit 104 by the 0-degree setting or the 180-degree setting of the output phase, and switches the on/off condition of the first amplifying transistor 100a and the second amplifying transistor 100b.

When the output phase is set to 0 degrees, the first amplifying transistor 100a is turned on, and the second amplifying transistor 100b is turned off. Moreover, when the output phase is set to 180 degrees, the first amplifying transistor 100a is turned off, and the second amplifying transistor 100b is turned on.

The switching between on and off of the amplifying transistors 100a and 100b is implemented by changing, by the bias supply circuit 104, the DC bias voltage applied to the gate terminal. To the gate terminal of the on-state amplifying transistor, a predetermined DC bias voltage generated at the variable bias voltage generation circuit 116 is applied, and to the gate terminal of the off-state amplifying transistor, the ground potential (0 V) is applied.

In the bias supply circuit 104, the above-described gate bias condition is realized by controlling on (closed) and off (open) of the internal switches 170a, 170b, 172a and 172b. Here, when the output phase is set to 0 degrees, the switches 170a and 172b are turned off, the switches 170b and 172a are turned on, and the DC bias voltage is applied to the first amplifying transistor 100a. Moreover, when the output phase is set to 180 degrees, the switches 170a and 172b are turned on, the switches 170b and 172a are turned off, and the DC bias voltage is applied to the second amplifying transistor 100b. The condition of each portion in the output phase of 180 degrees is shown in FIG. 2.

Moreover, by changing the DC bias voltage supplied from the variable bias voltage generation circuit 116 to the amplifying transistors 100a and 100b, the variable gain function where the gains of the amplifying transistors 100a and 100b change can be implemented. By the variable gain function, the fluctuation in power loss amount due to the phase when the polarity-switching amplifier circuit is used for the phase shifter is compensated, and the gain in the whole phase range can be flattened.

When the amplifying transistors 100a and 100b are formed of dual-gate MOSFETs, the gate voltages Vg2a and Vg2b of the second MOSFETs 152a and 152b are, for example, predetermined fixed voltages. Alternatively, the gate voltages Vg2a and Vg2b may be switched in tandem with the switching of the DC bias voltage setting by the bias supply circuit 104.

The polarity-switching control circuits 114a and 114b output the polarity-switching signals a and b to the power source switch circuits 118a and 118b by the 0-degree setting or the 180-degree setting of the output phase, and switch the on/off condition of the power source switch circuits 118a and 118b.

When the output phase is set to 0 degrees, the power source switch circuit 118b is turned on, the power source switch circuit 118a is turned off, and bias current is supplied from the power source switch circuit 118b to the first amplifying transistor 100a through the transformer 110. When the output phase is set to 180 degrees, the power source switch circuit 118a is turned on, the power source switch circuit 118b is turned off, and bias current is supplied from the power source switch circuit 118a to the second amplifying transistor 100b through the transformer 110.

Moreover, the polarity-switching control circuits 114a and 114b output the polarity-switching signals a and b to the impedance adjustment circuits 120a and 120b by the 0-degree setting or the 180-degree setting of the output phase, and switch the on/off condition of the impedance adjustment circuits 120a and 120b.

When the output phase is set to 0 degrees, the impedance adjustment circuit 120b is turned on, the impedance adjustment circuit 120a is turned off, and the impedance of the positive terminal 142 of the balanced input of the transformer 110 is reduced. When the output phase is set to 180 degrees, the impedance adjustment circuit 120a is turned on, the impedance adjustment circuit 120b is turned off, and the impedance of the negative terminal 140 of the balanced input of the transformer 110 is reduced.

By the above-described operation of the polarity-switching amplifier circuit, an amplified signal is input to either one of the positive terminal 142 and the negative terminal 140 of the balanced input of the transformer 110 from either one of the first amplifying transistor 100a and the second amplifying transistor 100b by the setting of the output phase. Thereby, the polarity of the output signal at the positive terminal 144 and the negative terminal 146 of the balanced output of the transformer 110 is switched.

Next, the input matching circuits 102 of the polarity-switching amplifier circuit according to the first embodiment will be described. The input matching circuits 102 cause the input signal power to be supplied to the on-state amplifying transistor (the DC bias voltage is applied to the gate terminal) and not to be supplied to the off-state amplifying transistor (0 V is applied to the gate terminal).

For example, when the impedance of the input signal source is 50Ω, the input matching circuits 102 are circuits where the input impedance to the on-state amplifying transistor is 50Ω and the input impedance to the off-state amplifying transistor is higher than 50Ω. By using the input matching circuits 102 like this, the input signal power can be input to the on-state amplifying transistor with a low loss and high efficiency.

In the example of FIG. 2, a structure having the inductors 160 and 162 and the capacitances 164 is shown as the input matching circuits 102, the present disclosure is not limited to this structure.

Next, the gain improvement effect of the amplifying transistor of the polarity-switching amplifier circuit according to the first embodiment will be described. Here, as shown in FIG. 2, a case where the amplifying transistors 100 (100a, 100b) are dual-gate MOSFETs will be described.

Figure 4:
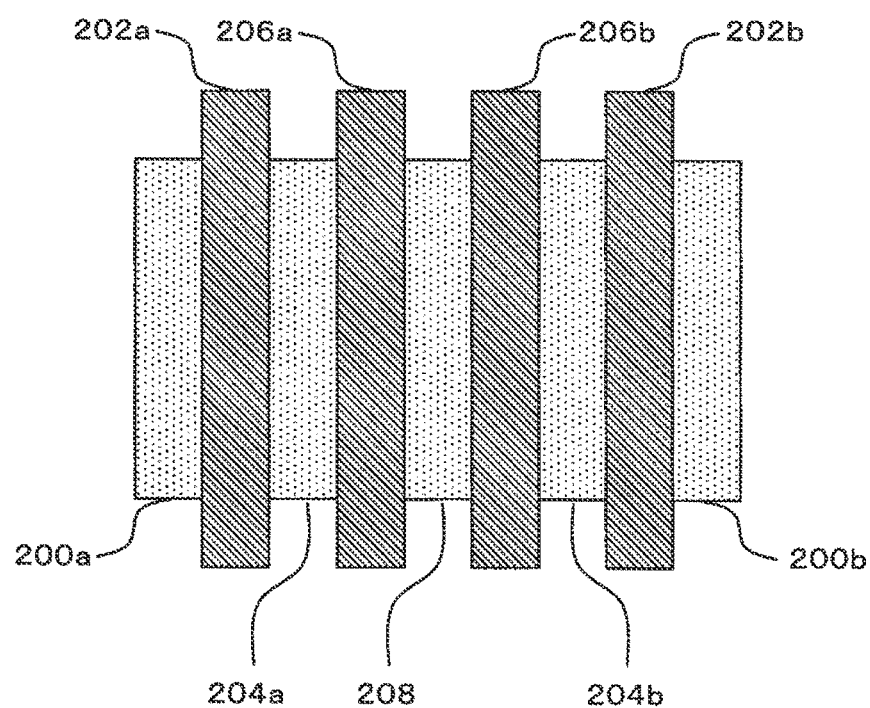
FIG. 4 is a plan view showing the structure of a dual-gate MOSFET in an integrated circuit.

FIG. 4 is a plan view showing the structure of a dual-gate MOSFET in an integrated circuit. In FIG. 4, an example of the plane composition of the dual-gate MOSFET having the first MOSFET and the second MOSFET.

The dual-gate MOSFET has source regions 200 (200a, 200b) of the first MOSFET, gate regions 202 (202a, 202b) of the first MOSFET, regions 204 (204a, 204b) that are the drain of the first MOSFET and the source of the second MOSFET, gate regions 206 (206a, 206b) of the second MOSFET and a drain region 208 of the second MOSFET. By the structure of the above-mentioned regions 200 to 208, the dual-gate MOSFET is formed on the semiconductor board as an integral structure.

By the structure where the drain of the first MOSFET and the source of the second MOSFET are the same regions 204, compared with the cascade connection using individual MOSFETs, the wiring at the connection of the first MOSFET and the second MOSFET and the parasitic component by the diffusion layer are reduced and the matching circuit for connection is unnecessary. For this reason, the power loss at high frequencies is reduced.

While a case where the amplifying transistors are dual-gate MOSFETs is described above, the present disclosure is not limited thereto. For example, source-grounded amplifiers formed of one-stage MOSFETs may be used.

Next, reduction in the phase error in the polarity switching of the polarity-switching amplifier circuit according to the first embodiment and gain error will be described.

Figure 5:
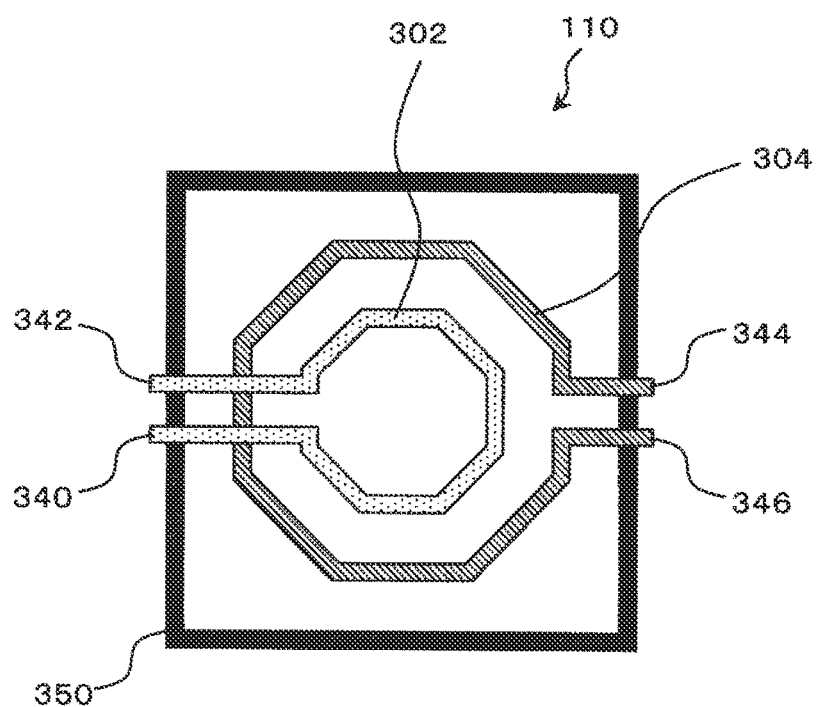
FIG. 5 is a plan view showing the structure of a transformer having four terminals in an integrated circuit.

FIG. 5 is a plan view showing the structure of the transformer 110 having four terminals in an integrated circuit. In FIG. 5, an example of the structure of the wiring layout of the four-terminal transformer 110 is shown.

The transformer 110 has a positive terminal 342 of the balanced input (corresponding to 142 of FIG. 2), a negative terminal 340 of the balanced input (corresponding to 140 of FIG. 2), a positive terminal 344 of the balanced output (corresponding to 144 of FIG. 2) and a negative terminal 346 of the balanced output (corresponding to 146 of FIG. 2).

The transformer 110 has a structure in which a looped secondary winding pattern 304 is concentrically disposed around a looped primary winding pattern 302 on the semiconductor substrate. Parts of the primary winding pattern 302 are parallelly extended outward to form the positive terminal 342 and the negative terminal 340 of the balanced input. Parts of the secondary winding pattern 304 are parallelly extended outward to form the positive terminal 344 and the negative terminal 346 of the balanced output. On the periphery of the primary winding pattern 302 and the secondary winding pattern 304, for example, a square ground pattern 350 is formed along the entire perimeter.

By the negative terminal 346 of the balanced output connecting with the ground pattern 350 of AC ground, the positive terminal 344 of the balanced output becomes an unbalanced output terminal, and the transformer 110 operates as a balanced-to-unbalanced transformer circuit.

As shown in FIG. 5, the layout of the transformer 110 is such that the disposition of the unbalanced output (the positive terminal 344 of the balanced output) is not symmetric with respect to the positive terminal 342 and the negative terminal 340 as the balanced input because of the presence of the negative terminal 346 of the balanced output connecting with the ground pattern 350. The four-terminal transformer formed in a typical integrated circuit has the structure shown in FIG. 5. Therefore, in the above-described polarity-switching function, there are cases where errors occur in a phase difference of 180 degrees in the unbalanced output and the output power according to whether the signal is input from the positive terminal 342 of the balanced input or the signal is input from the negative terminal 340 of the balanced input.

Therefore, in FIG. 2, by making the structure different between the positive terminal 142 side and the negative terminal 140 side of the balanced input and adjusting the impedances of these terminals, the phase error and the gain error can be reduced. Specifically, a structure is provided in which with respect to the power source switch circuit 118b and the impedance adjustment circuit 120b connecting with the positive terminal 142 of the balanced input and the power source switch circuit 118a and the impedance adjustment circuit 120a connecting with the negative terminal 140 of the balanced input in FIG. 2, they have different circuit configurations or element values and are different in impedance characteristics.

For example, when power source switch circuits 118 using pMOSFETs are adopted, pMOSFETs of different sizes are used for the power source switch circuit 118a and for the power source switch circuit 118b. For example, when impedance adjustment circuits 120 using the capacitances 190 and the nMOSFETs 192 are adopted, capacitances 190a and 190b and nMOSFETs 192a and 192b of different sizes are used for the impedance adjustment circuit 120a and for the impedance adjustment circuit 120b.

While a structure in which pMOSFETs are provided as the power source switch circuits 118 is shown in the example of FIG. 2, the present disclosure is not limited thereto. Moreover, while a structure in which the capacitances 190 and the nMOSFETs 192 are provided as the impedance adjustment circuits 120 is shown in the example of FIG. 2, the present disclosure is not limited thereto.

Moreover, the power error can also be reduced by changing the DC bias voltage applied from the variable bias voltage generation circuit 116 by the 0-degree setting or the 180-degree setting of the output phase.

Next, advantageous effects of the polarity-switching amplifier circuit according to the first embodiment will be described.

In the present embodiment, the signal branch for polarity switching is realized by the on/off of the DC bias voltage to the amplifying transistors 100a and 100b and the switching of the input impedance of the input matching circuits 102a and 102b by using the input matching circuits 102 and the bias supply circuit 104. Thereby, the signal can be branched with a low-loss circuit configuration, so that the power loss can be reduced.

Moreover, by connecting the outputs of the first amplifying transistor 100a and the second amplifying transistor 100b to the balanced input of the transformer 110, the signal branch in the outputs of the amplifying transistors 100a and 100b is unnecessary. Thereby, connecting parts and branching parts by wiring can be reduced, and the power loss in the amplifying transistor output can be reduced.

Moreover, in the polarity-switching amplifier circuit, by reducing connecting parts and branching parts, the number of matching circuits can be reduced, so that the loss due to the matching circuits can be reduced and this contributes to reduction in circuit size and reduction in the number of parts.

While the output of the transformer 110 is an unbalanced signal in the above-described first embodiment, the present disclosure is not limited thereto. As long as the structure is such that the output signal of the amplifying transistor is input to one side of the balanced input of the transformer, one of the outputs of the polarity-switching amplifier circuit may be a balanced output without being grounded.

Second Embodiment

Figure 6:
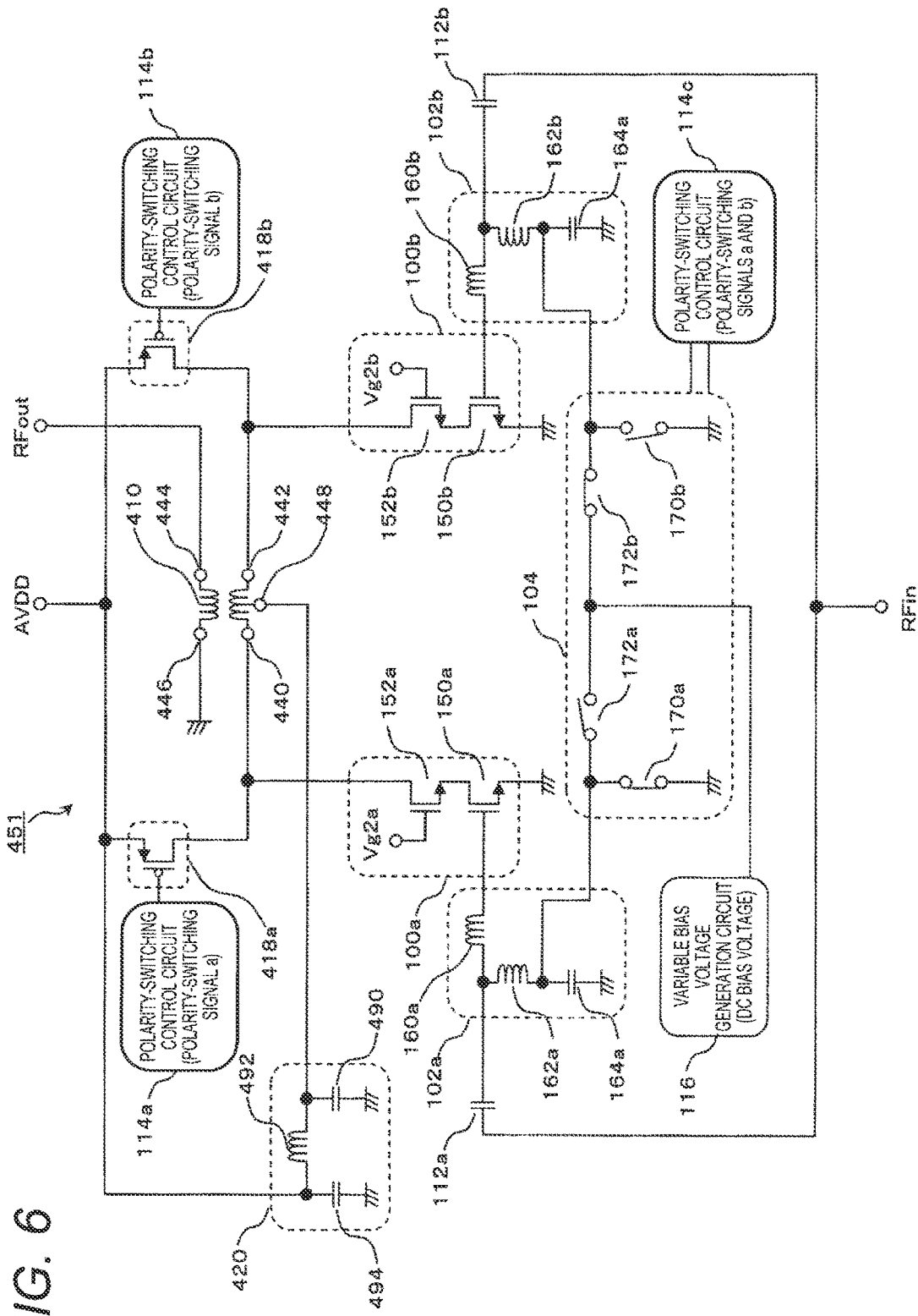
FIG. 6 is a block diagram showing the structure of a polarity-switching amplifier circuit according to a second embodiment.

FIG. 6 is a block diagram showing the structure of a polarity-switching amplifier circuit according to a second embodiment of the present disclosure. The second embodiment is an example in which the structure of the output side of the first amplifying transistor 100a and the second amplifying transistor 100b is changed. Similar elements to those of the first embodiment are denoted by the same reference numerals and descriptions thereof are omitted, and description will be given with a focus on parts different from the first embodiment.

The polarity-switching amplifier circuit 451 shown in FIG. 6 has the capacitive couplings 112 (112a, 112b), the input matching circuits 102 (102a, 102b), the amplifying transistors 100 (100a, 100b), the bias supply circuit 104, the polarity-switching control circuits 114 (114a, 114b, 114c), the variable bias voltage generation circuit 116, impedance adjustment circuits 418 (418a, 418b), a power source impedance circuit 420, and a transformer 410. The polarity-switching amplifier circuit 451 has an unbalanced input terminal (RFin) and an unbalanced output terminal (RFout).

The structure from the unbalanced input terminal (RFin) to the first amplifying transistor 100a and the second amplifying transistor 100b is similar to that of the first embodiment shown in FIG. 2. In the polarity-switching amplifier circuit 451 of the second embodiment, with respect to the structure of the first embodiment, the structure of the transformer 410 is changed, and the impedance adjustment circuits 418 and the power source impedance circuit 420 are provided instead of the power source switch circuits 118 and the impedance adjustment circuits 120.

In the following, the transformer 410, the power source impedance circuit 420 and the impedance adjustment circuits 418 will be described.

The transformer 410 has a five-terminal structure having a primary winding and a secondary winding where the primary winding side is balanced input terminals, the second winding side is balanced output terminals and a center tap is provided at the primary winding.

The output terminal of the first amplifying transistor 100a (the drain of the second MOSFET 152a) is connected to a negative terminal 440 of the balanced input of the transformer 410. The output terminal of the second amplifying transistor 100b (the drain of the second MOSFET 152b) is connected to a positive terminal 442 of the balanced input of the transformer 410. A center tap terminal 448 of the balanced input of the transformer 410 is connected to the power source impedance circuit 420.

Moreover, to the positive terminal 442 of the balanced input of the transformer 410, the impedance adjustment circuit 418b is connected, and to the negative terminal 440 of the balanced input of the transformer 410, the impedance adjustment circuit 418a is connected.

The signal input to the balanced input of the transformer 410 is output from a positive terminal 444 of the balanced output and a negative terminal 446 of the balanced output. In the illustrated example, the negative terminal 446 of the balanced output of the transformer 410 is grounded to AC ground, the positive terminal 444 of the balanced output is the unbalanced output terminal (RFout), and the output signal is output from the positive terminal 444 (RFout).

The power source impedance circuit 420 is a CLC low-pass filter of a π-type configuration having capacitances 490 and 494 one ends of which are grounded and an inductor 492 connected between the capacitances 490 and 494. The power source impedance circuit 420 has its one end connected to the center tap terminal 448 of the balanced input of the transformer 410 and the other end thereof connected to the power source, and the source voltage AVDD is applied thereto. That is, bias current is supplied to the first amplifying transistor 100a or the second amplifying transistor 100b from the power source through the power source impedance circuit 420.

The impedance adjustment circuits 418 (418a, 418b) have a structure similar to that of the power source switch circuits 118 of the first embodiment, and are formed of, for example, pMOSFETs. To the gates of the pMOSFETs, the polarity-switching control circuits 114a and 114b are connected, and the impedance adjustment circuits 418a and 418b are switched between on and off by the polarity-switching signals a and b. The impedance adjustment circuits 418 have the function of adjusting the impedance by turning on the off-state amplifying transistor side and making the potential of the output terminal (drain) of the off-state amplifying transistor the same as that of the source voltage AVDD.

Next, the polarity-switching function of the polarity-switching amplifier circuit according to the second embodiment will be described. FIG. 7 is a view showing the relation between the output phase setting and the on/off condition of each portion in the polarity-switching amplifier circuit according to the second embodiment, and shows the condition of each portion when the output phase is 0-degree setting or 180-degree setting.

The polarity-switching control circuits 114a and 114b output the polarity-switching signals a and b to the impedance adjustment circuits 418a and 418b by the 0-degree setting or the 180-degree setting of the output phase, and switch the on/off condition of the impedance adjustment circuits 418a and 418b.

When the output phase is set to 0 degrees (the first amplifying transistor 100a is on), the impedance adjustment circuit 418b is turned on and the impedance adjustment circuit 418a is turned off. When the output phase is set to 180 degrees (the second amplifying transistor 100b is on), the impedance adjustment circuit 418a is turned on and the impedance adjustment circuit 418b is turned off.

One ends of the impedance adjustment circuits 418 (the source sides of the pMOSFETs of FIG. 6) are connected to the power source, and the center tap terminal 448 of the transformer 410 is also connected to the power source through the power source impedance circuit 420. Therefore, since the DC voltages at both ends of the on-state impedance adjustment circuits 418 are the same, no DC current flows.

That is, when the output phase is set to 0 degrees, bias current is supplied from the power source to the first amplifying transistor 100a through the power source impedance circuit 420 and the center tap terminal 448 of the transformer 410. Moreover, the impedance adjustment circuit 418b is turned on to reduce the impedance of the positive terminal 442 of the balanced input of the transformer 410. When the output phase is set to 180 degrees, bias current is supplied from the power source to the second amplifying transistor 100b through the power source impedance circuit 420 and the center tap terminal 448 of the transformer 410. Moreover, the impedance adjustment circuit 418a is turned on to reduce the impedance of the negative terminal 440 of the balanced input of the transformer 410.

By the above-described operation of the polarity-switching amplifier circuit, an amplified signal is input to either one of the positive terminal 442 and the negative terminal 440 of the balanced input of the transformer 410 from either one of the first amplifying transistor 100a and the second amplifying transistor 100b by the setting of the output phase. Thereby, the polarity of the output signal at the positive terminal 444 and the negative terminal 446 of the balanced output of the transformer 410 is switched.

Next, reduction in the phase error in the polarity switching of the polarity-switching amplifier circuit according to the second embodiment and the gain error will be described.

Figure 8:
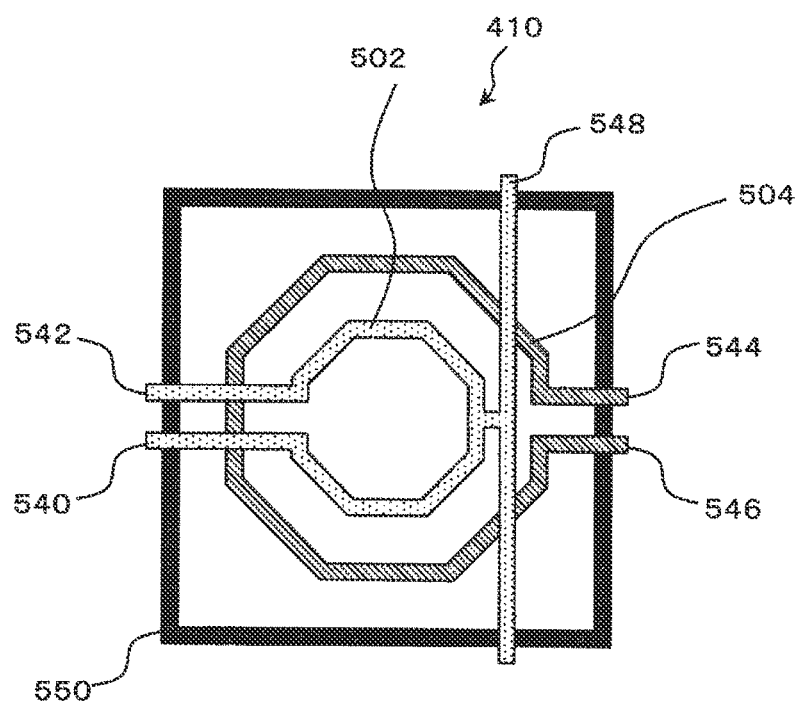
FIG. 8 is a plan view showing the structure of a transformer having five terminals in an integrated circuit.

FIG. 8 is a plan view showing the structure of the transformer 410 having five terminals in an integrated circuit. In FIG. 8, an example of the structure of the wiring layout of the five-terminal transformer 410 is shown.

The transformer 410 has a positive terminal 542 of the balanced input (corresponding to 442 of FIG. 6), a negative terminal 540 of the balanced input (corresponding to 440 of FIG. 6), a center tap terminal 548 of the balanced input (corresponding to 448 of FIG. 6), a positive terminal 544 of the balanced output (corresponding to 444 of FIG. 6), and a negative terminal 546 of the balanced output (corresponding to 446 of FIG. 6).

The transformer 410 has a structure in which a looped secondary winding pattern 504 is concentrically disposed around a looped primary winding pattern 502 on the semiconductor substrate. Parts of the primary winding pattern 502 are parallelly extended outward to form the positive terminal 542 and the negative terminal 540 of the balanced input. Moreover, the wiring pattern of the center tap is extended from the midpoint of the primary winding pattern 502 to form the center tap terminal 548 of the balanced input. Parts of the secondary winding pattern 504 are parallelly extended outward to form the positive terminal 544 and the negative terminal 546 of the balanced output. On the periphery of the primary winding pattern 502 and the secondary winding pattern 504, for example, a square ground pattern 550 is formed along the entire perimeter.

By the negative terminal 546 of the balanced output connecting with the ground pattern 550 of AC ground, the positive terminal 544 of the balanced output becomes an unbalanced output terminal, and the transformer 410 operates as a balanced-unbalanced conversion circuit.

As shown in FIG. 8, the layout of the transformer 410 is such that the disposition of the unbalanced output (the positive terminal 544 of the balanced output) is not symmetric with respect to the positive terminal 542 and the negative terminal 540 as the balanced input because of the negative terminal 546 of the balanced output connecting with the ground pattern 550. For the five-terminal transformer formed in a typical integrated circuit, a structure as shown in FIG. 8 is used. Therefore, in the above-described polarity-switching function, there are cases where errors occur in a phase difference of 180 degrees in the unbalanced output and the output power according to whether the signal is input from the positive terminal 542 of the balanced input or the signal is input from the negative terminal 540 of the balanced input.

Therefore, in FIG. 6, by making the structure different between the positive terminal 442 side and the negative terminal 440 side of the balanced input and adjusting the impedances of these terminals, the phase error and the gain error can be reduced. Specifically, a structure is provided in which with respect to the impedance adjustment circuit 418b connecting with the positive terminal 442 of the balanced input and the impedance adjustment circuit 418a connecting with the negative terminal 440 of the balanced input in FIG. 6, the impedance characteristics are different. That is, the impedance adjustment circuits 418 assume the role of adjusting the impedances of the negative terminal 440 and the positive terminal 442 of the balanced input of the transformer 410.

For example, impedance adjustment circuits 418 using pMOSFETs are adopted, pMOSFETs of different sizes are used for the impedance adjustment circuit 418a and for the impedance adjustment circuit 418b.

Moreover, by changing the impedance at the center tap terminal 448 of the transformer 410 by the structure of the power source impedance circuit 420, the phase error and the gain error can be reduced.

While a structure in which pMOSFETs are provided as the impedance adjustment circuits 418 is shown in the example of FIG. 6, the present disclosure is not limited thereto. Moreover, while a CLC low-pass filter of a n-type configuration having the capacitances 490 and 494 and the inductor 492 is shown as the power source impedance circuit 420 in the example of FIG. 2, the present disclosure is not limited thereto.

In the polarity-switching amplifier circuit of the second embodiment, by realizing the signal branch for polarity switching by using the input matching circuits 102 and the bias supply circuit 104 as in the first embodiment, the signal can also be branched with a low-loss circuit configuration, so that the power loss can be reduced.

Moreover, since the signal branch in the outputs of the first amplifying transistor 100a and the second amplifying transistor 100b is unnecessary, connecting parts and branching parts by the wiring can be reduced, and the power loss in the amplifying transistor output can be reduced.

Moreover, by supplying the bias current from the power source to the amplifying transistors 100a and 100b by the power source impedance circuit 420, the resistive component on the bias current supply path is reduced and the power loss can be further reduced compared with the structure as in the first embodiment where the bias current is supplied through the power source switch circuits 118.

Moreover, since the off-state circuits connected to the negative terminal 440 and the positive terminal 442 of the balanced input of the transformer 410 are the impedance adjustment circuits 418, the impedance adjustment circuits 120 used in the first embodiment are unnecessary, so that the parasitic component of the circuit at the signal output portion is reduced and the power loss can be further reduced.

While the output of the transformer 410 is an unbalanced signal in the above-described embodiment, the present disclosure is not limited thereto. As long as the structure is such that the output signal of the amplifying transistor is input to one side of the balanced input of the transformer, one of the outputs of the polarity-switching amplifier circuit may be a balanced output without being grounded.

Various modes of the embodiments according to the present disclosure include the following:

A polarity-switching amplifier circuit according to a first disclosure is provided with: a first amplifying transistor and a second amplifying transistor to which an unbalanced input signal is input; a transformer having a primary winding and a secondary winding where an output signal of the first amplifying transistor and an output signal of the second amplifying transistor are input to the primary winding as balanced signals and a signal is output from the secondary winding; and a polarity-switching controller that turns on one of the first amplifying transistor and the second amplifying transistor and turns off the other thereof.

In the above-described structure, for example, the output of the first amplifying transistor is connected to the negative terminal of the balanced input of the transformer, the output of the second amplifying transistor is connected to the positive terminal of the balanced input of the transformer, and either one of the first amplifying transistor and the second amplifying transistor is turned on and the other thereof is turned off according to the 0-degree setting and the 180-degree setting of the transformer. Thereby, by turning on and off the first and second amplifying transistors, the polarity of the signal output from the transformer is switched, whereby the polarity of the output signal can be reversed. Consequently, the signal branch for polarity switching can be realized with a low-loss circuit configuration, so that the power loss can be reduced.

In the polarity-switching amplifier circuit according to a second disclosure, in the polarity-switching amplifier circuit of the above-described first disclosure, the polarity-switching controller switches on and off of the first amplifying transistor and the second amplifying transistor by performing switching setting of a DC bias voltage of an input terminal of the first amplifying transistor and a DC bias voltage of an input terminal of the second amplifying transistor.

The polarity-switching amplifier circuit according to a third disclosure is further provided with, in the above-described polarity-switching amplifier circuit of the first or the second disclosure, a first input matching circuit connecting an input terminal of the unbalanced input signal and the first amplifying transistor and a second input matching circuit connecting the input terminal of the unbalanced input signal and the second amplifying transistor.

In the polarity-switching amplifier circuit according to a fourth disclosure, in the polarity-switching amplifier circuit of the above-described third disclosure, the first input matching circuit performs matching with an impedance of an input signal source when the first amplifying transistor is on, and an impedance is higher than the impedance of the input signal source when the first amplifying transistor is off, and the second input matching circuit performs matching with the impedance of the input signal source when the second amplifying transistor is on, and an impedance is higher than the impedance of the input signal source when the second amplifying transistor is off.

In the polarity-switching amplifier circuit according to a fifth disclosure, in the polarity-switching amplifier circuit of any of the above-described first to fourth disclosures, the first amplifying transistor and the second amplifying transistor include a dual-gate MOSFET.

In the polarity-switching amplifier circuit according to a sixth disclosure, in the polarity-switching amplifier circuit of the above-described second disclosure, the polarity-switching controller changes gains of the first and second amplifying transistors by changing the DC bias voltage.

In the polarity-switching amplifier circuit according to a seventh disclosure, in the polarity-switching amplifier circuit of any of the above-described first to sixth disclosures, the transformer has four terminals of a balanced input positive terminal, a balanced input negative terminal, a balanced output positive terminal and a balanced output negative terminal, an output terminal of the first amplifying transistor and the balanced input negative terminal are connected, and an output terminal of the second amplifying transistor and the balanced input positive terminal are connected, and the following are provided: a first power source switch circuit connecting the balanced input positive terminal and a power source; a second power source switch circuit connecting the balanced input negative terminal and the power source; and a power switch controller that switches on and off of the first power source switch circuit and the second power source switch circuit in conjunction with the polarity-switching controller.

In the polarity-switching amplifier circuit according to an eighth disclosure, in the polarity-switching amplifier circuit of the above-described seventh disclosure, the first power source switch circuit and the second power source switch circuit have different circuit configurations or element values.

By the above-described structure, by providing different circuit configurations or element values, the characteristics of the impedances of the first power source switch circuit and the second power source switch circuit are made different and the impedances of the balanced input positive terminal and the balanced input negative terminal of the transformer are adjusted. Consequently, the phase error and the gain error can be reduced.

The polarity-switching amplifier circuit according to a ninth disclosure is further provided with, in the polarity-switching amplifier circuit of the above-described seventh or eighth disclosure, a first impedance adjustment circuit connecting the balanced input positive terminal and ground, a second impedance adjustment circuit connecting the balanced input negative terminal and ground, and an impedance controller that switches impedances of the first impedance adjustment circuit and the second impedance adjustment circuit in conjunction with the polarity-switching controller.

In the polarity-switching amplifier circuit according to a tenth disclosure, in the polarity-switching amplifier circuit of the above-described ninth disclosure, the first impedance adjustment circuit and the second impedance adjustment circuit have different circuit configurations or element values.

By the above-described structure, by providing different circuit configurations or element values, the characteristics of the impedances of the first impedance adjustment circuit and the second impedance adjustment circuit are made different and the impedances of the balanced input positive terminal and the balanced input negative terminal of the transformer are adjusted. Consequently, the phase error and the gain error can be reduced.

In the polarity-switching amplifier circuit according to an eleventh disclosure, in the polarity-switching amplifier circuit of the above-described ninth or tenth disclosure, the first impedance adjustment circuit and the second impedance adjustment circuit have a series connection of a transistor and a capacitance, and the impedance controller switches on and off of the transistor.

In the polarity-switching amplifier circuit according to a twelfth disclosure, in the polarity-switching amplifier circuit of any of the above-described ninth to eleventh disclosures, either one of the balanced output positive terminal and the balanced output negative terminal is connected to AC ground, and an output signal is an unbalanced signal.

In the polarity-switching amplifier circuit according to a thirteenth disclosure, in the polarity-switching amplifier circuit of any of the above-described first to sixth disclosures, the transformer has five terminals of a balanced input positive terminal, a balanced input negative terminal, a balanced output positive terminal, a balanced output negative terminal and a balanced input center tap terminal, an output terminal of the first amplifying transistor and the balanced input negative terminal are connected, and an output terminal of the second amplifying transistor and the balanced input positive terminal are connected, and the balanced input center tap terminal and a power source are connected.

The polarity-switching amplifier circuit according to a fourteenth disclosure is further provided with, in the polarity-switching amplifier circuit of the above-described thirteenth disclosure, a first impedance adjustment circuit connecting the balanced input positive terminal and a power source; a second impedance adjustment circuit connecting the balanced input negative terminal and the power source; and an impedance controller that switches impedances of the first impedance adjustment circuit and the second impedance adjustment circuit in conjunction with the polarity-switching controller.

In the polarity-switching amplifier circuit according to a fifteenth disclosure, in the polarity-switching amplifier circuit of the above-described fourteenth disclosure, the first impedance adjustment circuit and the second impedance adjustment circuit have different circuit configurations or element values.

By the above-described structure, by providing different circuit configurations or element values, the characteristics of the impedances of the first impedance adjustment circuit and the second impedance adjustment circuit are made different and the impedances of the balanced input positive terminal and the balanced input negative terminal of the transformer are adjusted. Consequently, the phase error and the gain error can be reduced.

The polarity-switching amplifier circuit according to a sixteenth disclosure is further provided with, in the polarity-switching amplifier circuit of any of the above-described thirteenth to fifteenth disclosures, a power source impedance circuit that connects the balanced input center tap terminal and the power source.

In the polarity-switching amplifier circuit according to a seventeenth disclosure, in the polarity-switching amplifier circuit of the above-described sixteenth disclosure, the power source impedance circuit has a low-pass filter.

In the polarity-switching amplifier circuit according to an eighteenth disclosure, in the polarity-switching amplifier circuit of any of the above-described thirteenth to seventeenth disclosures, either one of the balanced output positive terminal and the balanced output negative terminal is connected to AC ground, and an output signal is an unbalanced signal.

While various embodiments have been described with reference to the drawings, it is to be noted that the present disclosure is not limited to such examples. It is obvious that one of ordinary skill in the art can arrive at various change examples or modification examples within the category described in the scope of the claims, and it is to be understood that these naturally belong to the technical scope of the present disclosure. Moreover, elements in the above-described embodiments may be arbitrarily combined without departing from the gist of the present disclosure.

The present application is based upon Japanese Patent Application (No. 2013-073669) filed on Mar. 29, 2013, the contents of which are incorporated herein by reference.

INDUSTRIAL APPLICABILITY

The present disclosure has an advantage that a polarity-switching amplifier circuit with a low power loss can be provided, and is useful as a polarity-switching amplifier circuit and the like used for a phase shifter capable of changing phases of 0 to 360 degrees in high-frequency bands such as a millimeter-wave band.

DESCRIPTION OF REFERENCE SIGNS 100a, 100b: Amplifying Transistor
102a, 102b: Input Matching Circuit
104: Bias Supply Circuit
110: Transformer
112a, 112b: Capacitive Coupling
114a, 114b, 114c: Polarity-Switching Control Circuit
116: Variable Bias Voltage Generation Circuit
118a, 118b: Power Source Switch Circuit
120a, 120b: Impedance Adjustment Circuit
150a, 150b, 152a, 152b: MOSFET
151, 151A, 451: Polarity-Switching Amplifier Circuit
170a, 170b, 172a, 172b: Switch
410: Transformer
418a, 418b: Impedance Adjustment Circuit
420 Power Source Impedance Circuit

The invention claimed is:
1. A polarity-switching amplifier circuit comprising:
a first amplifying transistor and a second amplifying transistor, to which an unbalanced input signal is input;
a transformer which comprises a primary winding and a secondary winding, which receives an output signal of the first amplifying transistor and an output signal of the second amplifying transistor as a balanced signal input to the primary winding, and which outputs a signal from the secondary winding;

a polarity-switching controller which turns on one of the first amplifying transistor and the second amplifying transistor and turns off the other thereof;

a first input matching circuit which connects an input terminal of the unbalanced input signal and the first amplifying transistor; and a second input matching circuit which connects the input terminal of the unbalanced input signal and the second amplifying transistor.

2. The polarity-switching amplifier circuit according to claim 1, wherein the polarity-switching controller switches on and off of the first amplifying transistor and the second amplifying transistor by performing switching setting of a DC bias voltage of an input terminal of the first amplifying transistor and a DC bias voltage of an input terminal of the second amplifying transistor.

3. The polarity-switching amplifier circuit according to claim 1, wherein the first input matching circuit which performs matching with an impedance of an input signal source when the first amplifying transistor is on, and which provides an impedance higher than the impedance of the input signal source when the first amplifying transistor is off, and wherein the second input matching circuit which performs matching with the impedance of the input signal source when the second amplifying transistor is on, and which provides an impedance higher than the impedance of the input signal source when the second amplifying transistor is off.

4. The polarity-switching amplifier circuit according to claim 1, wherein the first amplifying transistor and the second amplifying transistor comprise a dual-gate MOSFET.

5. The polarity-switching amplifier circuit according to claim 2, wherein the polarity-switching controller changes gains of the first and second amplifying transistors by changing the DC bias voltages.

6. The polarity-switching amplifier circuit according to claim 1, wherein the transformer comprises four terminals of a balanced input positive terminal, a balanced input negative terminal, a balanced output positive terminal and a balanced output negative terminal, wherein an output terminal of the first amplifying transistor and the balanced input negative terminal are connected, and an output terminal of the second amplifying transistor and the balanced input positive terminal are connected, and wherein said polarity-switching amplifier circuit further comprises:

a first power source switch circuit which connects the balanced input positive terminal and a power source;

a second power source switch circuit which connects the balanced input negative terminal and the power source; and a power switch controller that switches on and off of the first power source switch circuit and the second power source switch circuit in conjunction with the polarity-switching controller.

7. The polarity-switching amplifier circuit according to claim 6, wherein the first power source switch circuit and the second power source switch circuit have different circuit configurations or element values.

8. The polarity-switching amplifier circuit according to claim 6, further comprising:

a first impedance adjustment circuit which connects the balanced input positive terminal and ground;

a second impedance adjustment circuit which connects the balanced input negative terminal and ground; and an impedance controller which switches impedances of the first impedance adjustment circuit and the second impedance adjustment circuit in conjunction with the polarity-switching controller.

9. The polarity-switching amplifier circuit according to claim 8, wherein the first impedance adjustment circuit and the second impedance adjustment circuit have different circuit configurations or element values.

10. The polarity-switching amplifier circuit according to claim 8, wherein the first impedance adjustment circuit and the second impedance adjustment circuit comprise a series connection of a transistor and a capacitance, and the impedance controller switches on and off of the transistor.

11. The polarity-switching amplifier circuit according to claim 8, wherein either one of the balanced output positive terminal and the balanced output negative terminal is connected to AC ground, and an output signal is an unbalanced signal.

12. The polarity-switching amplifier circuit according to claim 1, wherein the transformer comprises five terminals of a balanced input positive terminal, a balanced input negative terminal, a balanced output positive terminal, a balanced output negative terminal and a balanced input center tap terminal, wherein an output terminal of the first amplifying transistor and the balanced input negative terminal are connected, and an output terminal of the second amplifying transistor and the balanced input positive terminal are connected, and wherein the balanced input center tap terminal and a power source are connected.

13. The polarity-switching amplifier circuit according to claim 12, further comprising:

a first impedance adjustment circuit which connects the balanced input positive terminal and the power source;

a second impedance adjustment circuit which connects the balanced input negative terminal and the power source; and an impedance controller which switches impedances of the first impedance adjustment circuit and the second impedance adjustment circuit in conjunction with the polarity-switching controller.

14. The polarity-switching amplifier circuit according to claim 13, wherein the first impedance adjustment circuit and the second impedance adjustment circuit have different circuit configurations or element values.

15. The polarity-switching amplifier circuit according to claim 12, further comprising a power source impedance circuit which connects the balanced input center tap terminal and the power source.

16. The polarity-switching amplifier circuit according to claim 15,
  wherein the power source impedance circuit comprises a low-pass filter.

17. The polarity-switching amplifier circuit according to claim 12,
  wherein either one of the balanced output positive terminal and the balanced output negative terminal is connected to AC ground, and an output signal is an unbalanced signal.

* * * * *